(12) United States Patent
Zhou

(10) Patent No.: US 12,342,593 B2
(45) Date of Patent: Jun. 24, 2025

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 514 days.

(21) Appl. No.: 17/573,282

(22) Filed: Jan. 11, 2022

(65) Prior Publication Data

US 2022/0223701 A1    Jul. 14, 2022

(30) Foreign Application Priority Data

Jan. 14, 2021   (CN) .......................... 202110048972.8

(51) Int. Cl.
  *H10D 64/01*    (2025.01)
  *H10D 30/67*    (2025.01)
  *H10D 64/23*    (2025.01)

(52) U.S. Cl.
  CPC ....... *H10D 64/258* (2025.01); *H10D 30/6735* (2025.01); *H10D 30/6757* (2025.01); *H10D 64/017* (2025.01); *H10D 64/018* (2025.01)

(58) Field of Classification Search
  CPC .................... H01L 29/42392; H01L 29/66545
  See application file for complete search history.

(56) References Cited

U.S. PATENT DOCUMENTS

2020/0411667 A1* 12/2020 Wong ................ H01L 21/02293
2021/0407900 A1* 12/2021 Yu ....................... H01L 29/4175

FOREIGN PATENT DOCUMENTS

CN    107017295 A    8/2017

* cited by examiner

*Primary Examiner* — Michele Fan
(74) *Attorney, Agent, or Firm* — Anova Law Group, PLLC

(57) ABSTRACT

A semiconductor structure includes a base substrate including a first region and a second region. The semiconductor further includes a first fin member located over the first region, a second fin member located over the second region, a first dummy gate across a surface of the first fin member, and a second dummy gate across a surface of the second fin member. A first opening is formed in the first fin member located on each side of the first dummy gate, a second opening is formed between two adjacent first channel layers, a third opening is formed in the second fin member located at each side of the second dummy gate, and a fourth opening is formed between two second channel layers. The semiconductor structure still further includes a first inner spacer located in the second opening, and a second inner spacer located in the fourth opening.

16 Claims, 8 Drawing Sheets

SEMICONDUCTOR STRUCTURE AND FABRICATION METHOD THEREOF

CROSS-REFERENCE TO RELATED APPLICATION

This application claims priority of Chinese Patent Application No. 202110048972.8, filed on Jan. 14, 2021, the entire content of which is hereby incorporated by reference.

FIELD OF THE DISCLOSURE

The present disclosure generally relates to the field of semiconductor manufacturing technology and, more particularly, relates to a semiconductor structure and fabrication methods thereof.

BACKGROUND

In the existing semiconductor field, a fin field-effect transistor (FinFET) is an emerging multi-gate device. Compared with a planar metal-oxide semiconductor field-effect transistor (MOSFET), the FinFET can better suppress the short-channel effect and have a higher work current. The FinFET has been broadly applied in various semiconductor devices. However, with the further development of the semiconductor process, a size of transistors has shrunk to be less than a few nanometers. When the size of the FinFET itself has shrunk to the limit, the fin distance, short channel effect, leakage and material limits all make the transistor manufacturing has become precarious, and even the physical structure of the transistor manufacturing cannot be completed.

A gate-all-around (GAA) device has become a direction of research and development in the industry, which allows all around wrapping of the channel by the gate. A source and a drain are no longer in contact with a substrate. Instead, a plurality of sources and drains in a linear shape, a flat shape, a sheet shape, etc., are arranged horizontally and perpendicular to the channel to realize a basic structure and function of the MOSFET. Such a design may largely solve various problems, including a capacitance effect, etc. caused by reducing of the gate distance. In addition, as the channel are wrapped all around by the gate, channel current is also smoother than three-sided wrapping of the FinFET.

However, as an important development direction in the industry, there is a need to improve GAA devices.

BRIEF SUMMARY OF THE DISCLOSURE

One aspect of the present disclosure includes a semiconductor structure. The semiconductor structure includes a base substrate, and the base substrate includes a first region and a second region. The semiconductor structure further includes a first fin member located over the first region of the base substrate, and the first fin member includes first sacrificial layers stacked over each other and a first channel layer located between two adjacent first sacrificial layers. The semiconductor structure still further includes a second fin member located over the second region, and the second fin member includes second sacrificial layers stacked over each over and a second channel layer located between two adjacent second sacrificial layers. The semiconductor structure still further includes a first dummy gate across a surface of the first fin member and located on a portion top surface and a portion of sidewall surface of the first fin member, a second dummy gate across a surface of the second fin member and located on a portion of a top surface and a portion of sidewall surface of the second fin member. A first opening is formed in the first fin member located on each side of the first dummy gate, a second opening is formed between two adjacent first channel layers, a third opening is formed in the second fin member located at each side of the second dummy gate, and a fourth opening is formed between two second channel layers. The fourth opening is recessed relative to a sidewall of the second channel layer, and the sidewall of the corresponding second sacrificial layer exposed by the fourth opening protrudes or being flush with a sidewall of the second dummy gate. A first inner spacer is located in the second opening, and a second inner spacer is located in the fourth opening.

Another aspect of the present disclosure includes a fabrication method of a semiconductor structure. The fabrication method includes providing a base substrate, wherein the base substrate includes a first region and a second region. The fabrication method includes providing a first fin member located over the first region of the base substrate, and the first fin member includes first sacrificial layers stacked over each other and a first channel layer located between two adjacent first sacrificial layers. The fabrication method further includes providing a second fin member located over the second region, and the second fin member includes second sacrificial layers stacked over each over and a second channel layer located between two adjacent second sacrificial layers. The fabrication method further includes forming a first dummy gate across a surface of the first fin member, and the formed first dummy gate is located on a portion of a top surface and a portion of the sidewall surface of the first fin member. The fabrication method still further includes forming a second dummy gate across a surface of the second fin member, wherein the formed second dummy gate is located on a portion of a top surface and a portion of sidewall surface of the second fin member. The fabrication method still further includes forming a first opening on each side of the first dummy gate in the first fin member, forming a second opening between two adjacent first channel layers, wherein the formed second opening exposing a sidewall of the first sacrificial layer is recessed relative to a sidewall of the first dummy gate, forming a third opening on each side of the second dummy gate in the second fin member, forming a fourth opening located between two second channel layers, forming a first inner spacer in the second opening, and forming a second inner spacer in the fourth opening, wherein the formed fourth opening exposing a sidewall of a corresponding second sacrificial layer is recessed relative to a sidewall of the second dummy gate, and the sidewall of the corresponding second sacrificial layer exposed by the fourth opening protrudes or flush with the sidewall of the second dummy gate.

DETAILED DESCRIPTION

As used herein, the terms "surface" and "on/over" are used to describe the relative positional relationship in space, to include a direct contact and/or an indirect contact without limitation.

As described, performance of a semiconductor structure formed by the existing gate-all-around (GAA) device technology needs to be improved, and the above-described situation is explained and analyzed in conjunction with a semiconductor structure.

FIGS. 1 to 6 illustrate schematics of a semiconductor structure fabrication process.

Figure 1:
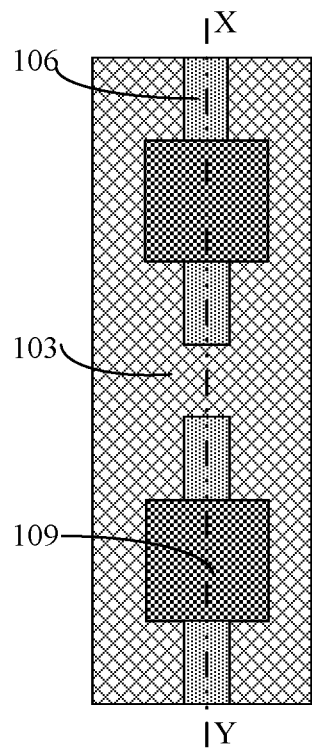
FIGS. 1 to 6 illustrate schematics of a fabrication process of a semiconductor structure.
Figure 2:
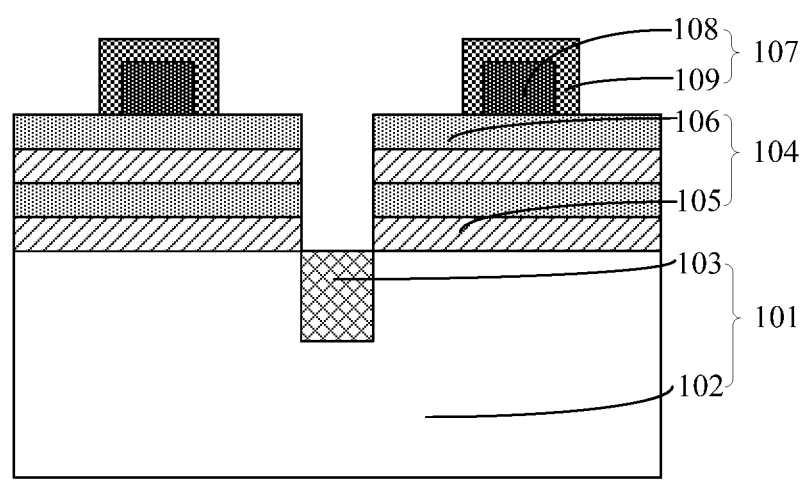

Referring to FIG. 1 and FIG. 2, FIG. 1 is a top view of a semiconductor structure, and FIG. 2 is a cross-sectional view of the semiconductor structure in FIG. 1 along an X-Y direction. As shown in FIGS. 1-2, a substrate 101 includes a base substrate 102 and an isolation region 103 in the substrate 101. A top surface of the isolation region 103 is flush with the surface of the substrate 101. An initial composite structure 104 is located over a portion of the substrate 101, and a dummy gate structure 107 is located over a portion of the initial composite structure 104. The dummy gate structure 107 includes a dummy gate 108 and a spacer 109. The initial composite structure 104 includes a plurality of stacked initial sacrificial layers 105 and an initial channel layer 106 located between two adjacent initial sacrificial layers 105.

Figure 3:
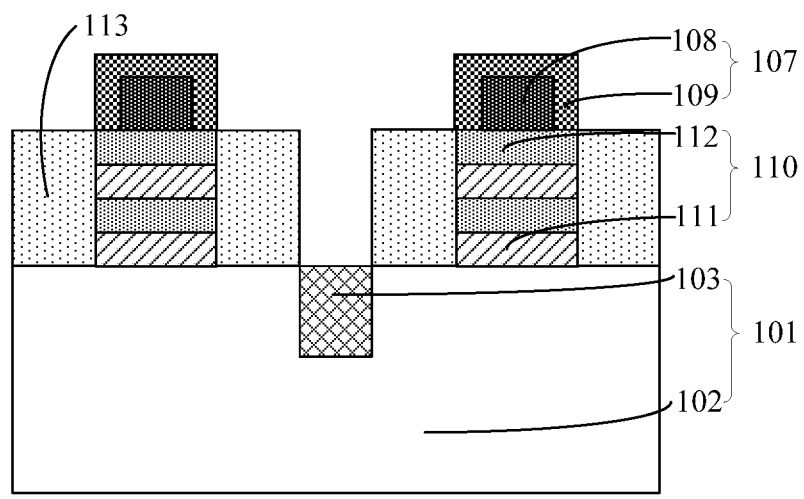

Referring to FIG. 3, the initial composite structure 104 is etched by using a dummy gate structure 107 as a mask to expose the substrate 101 and to form a composite structure 110. The initial sacrificial layer 105 is etched to form a sacrificial layer 111, and the initial channel layer 106 is etched to form a channel layer 112. A source-drain region 113 is formed above the substrate 101 of each of two sides of the dummy gate structure 107.

Figure 4:
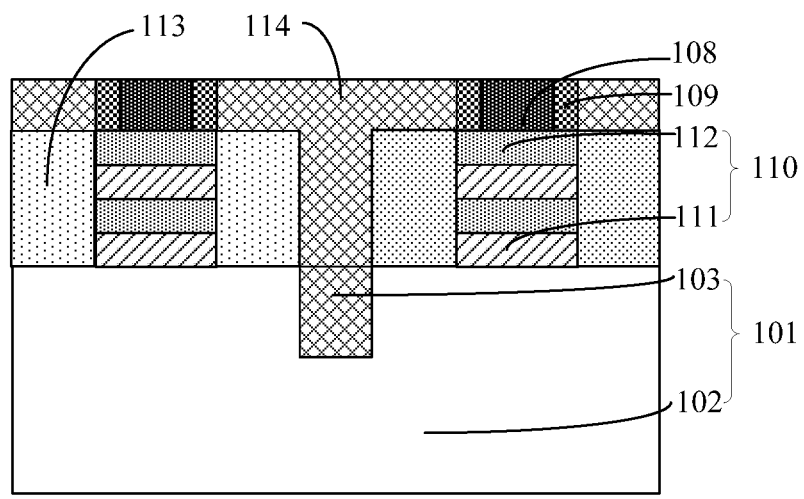

Referring to FIG. 4, an interlayer dielectric material layer (not shown)) is formed on the surface of the substrate 101. The interlayer dielectric material layer may be located over a sidewall and a top surface of the source-drain regions 113, and the interlayer dielectric material layer is further located over a sidewall and a top surface of the dummy gate structure 107. The interlayer dielectric material layer is planarized until a surface of the dummy gate 108 is exposed to form an interlayer dielectric layer 114.

Figure 5:
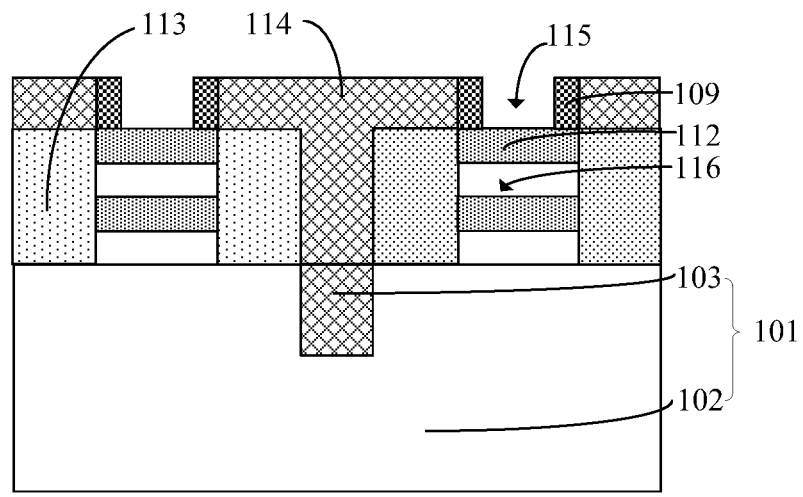

Referring to FIG. 5, the dummy gate 108 (as shown) is removed by etching. A gate opening 115 is formed in the interlayer dielectric layer 114. The sacrificial layer 111 (as shown) exposed at a bottom of the gate opening 115 is removed, and a groove 116 is formed between the gate opening 115 and a first channel layer 112.

Figure 6:
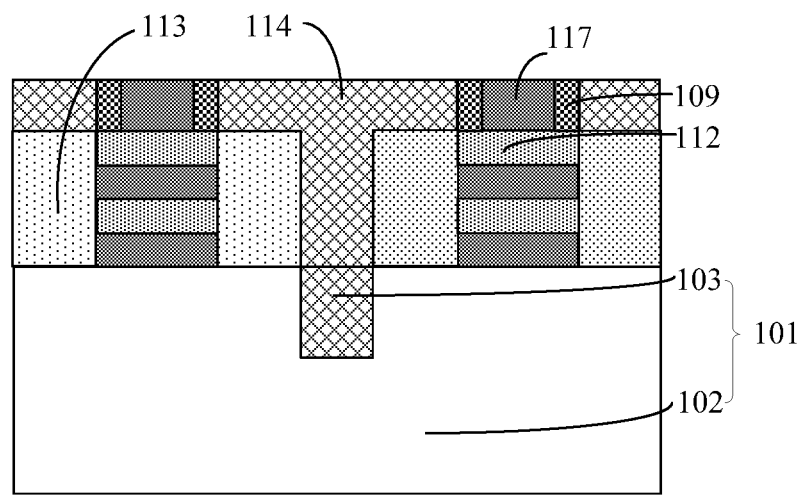

Referring to FIG. 6, metal material is filled in the gate opening 115 (as shown in FIG. 5) and the groove 116 (as shown in FIG. 5) to form a gate 117.

In the above-described method, channels are formed under the bottom of the gate 117 and between the source-drain regions 113. A length of the channel depends on the width of the gate 117 in a direction parallel to the surface of the substrate, and the width of the gate 117 depends on the width of the dummy gate 108, that is, the width of the gate 117 is determined by the photolithography process of the dummy gate 108. The width of the formed gate opening 115 is smaller than the width of the groove 116. Therefore, in a process of filling the gate opening 115 and the groove 116 with the metal material, a filling failure phenomenon may occur. For example, the gate opening 115 may be closed before the groove 116 is filled entirely, a cavity may be generated in the groove 116 and thus generated in the formed gate 117, thereby affecting the performance of the semiconductor device.

To solve the above-described problem, the present disclosure provides a semiconductor structure and a fabrication method. In the method, after a first opening is formed, a first sacrificial layer is etched to form a second opening between two adjacent first channel layers. The sidewall of the first sacrificial layer exposed by the second opening is recessed relative to the sidewall of the first dummy gate. In one aspect, a thickness of a first inner spacer and a second inner spacer may be different, and the thickness of the first inner spacer may be adjusted by adjusting a size of the second opening. As such, after the gate is subsequently formed, the length of the first channel layer (that is, the channel) wrapped by the gate may be able to be adjusted. In another aspect, in the subsequent gate fabrication process, a width of the first trench is greater than a width of a second trench, which facilitates the filling of the gate material in the second trench, so as to reduce closure of the first trench that is above the second trench before the second trench is filled, which reduces the probability of defects in the formed gate, thereby improving the performance of the formed semiconductor device.

To make the above objectives, features, and beneficial effects of the present disclosure more notable and understandable, embodiments of the present disclosure are described in detail below with reference to the accompanying drawings.

FIGS. 7 to 14 illustrate schematics structural diagram of an exemplary semiconductor structure at various stages during fabrication consistent with various disclosed embodiments of the present disclosure.

Figure 7:
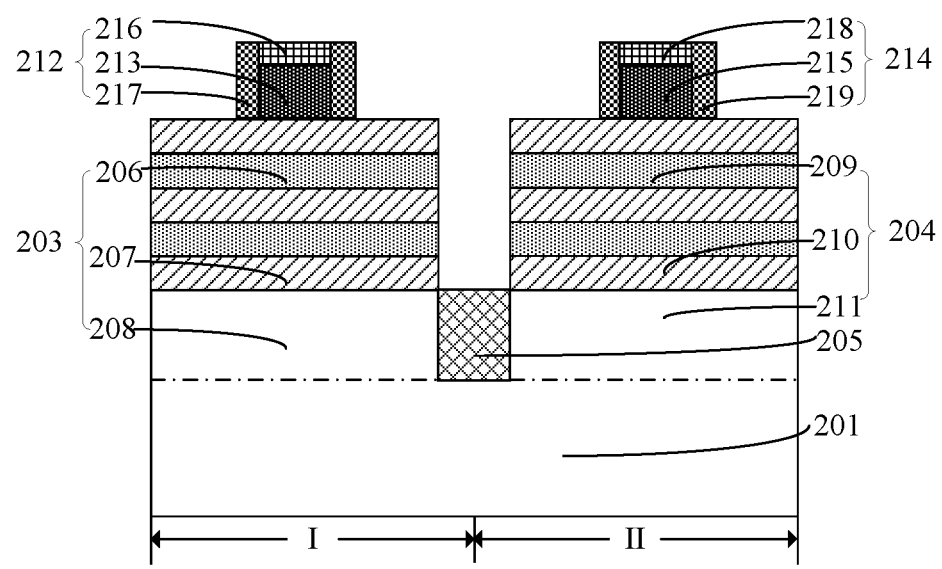
FIGS. 7 to 14 illustrate schematics structural diagram of an exemplary semiconductor structure at various stages during fabrication consistent with various disclosed embodiments of the present disclosure.
Figure 8:
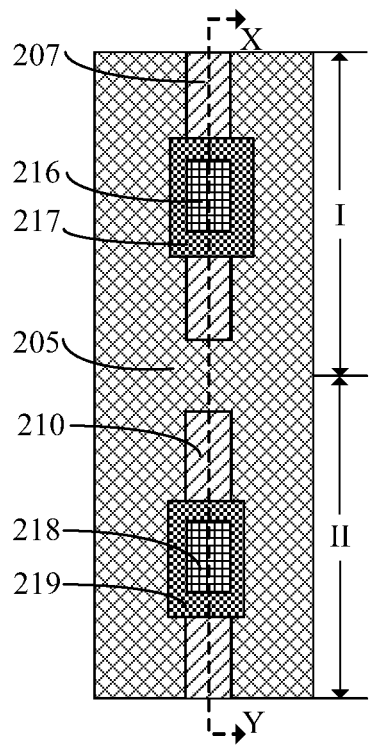

Referring to FIGS. 7 and 8, FIG. 8 is a top view of the semiconductor structure, FIG. 7 is a cross-sectional of semiconductor structure in FIG. 8 along an X-Y direction. As shown in FIGS. 7-8, a base substrate 201 includes a first region I and a second region II. A first fin member 203 is located over the first region I of the base substrate. The first fin member 203 includes a plurality of first sacrificial layers 207 stacked over each other and a first channel layer 206 located between two adjacent first sacrificial layers 207. A second fin member 204 is located over the second region II of the base substrate. The second fin member 204 includes a plurality of second sacrificial layers 210 stacked over each other and a second channel layer 209 located between two adjacent second sacrificial layers. A first dummy gate 213 is formed across a surface of the first fin member 203, and the first dummy gate 213 is located on a portion of a top surface and a portion of the sidewall surface of the first fin member 203. A second dummy gate 214 is formed across a surface of a second fin member 204, and the second dummy gate 215 is located at a portion of a top surface and a portion of the sidewall surface of the second fin member 214.

A material of the first sacrificial layers 207 is different from a material of the first channel layer 206. In some embodiments, the material of the first sacrificial layers 207 is SiGe, and the material of the first channel layer 206 is Si. In other embodiments, the material of the first channel layer may be Ge or SiGe, and the material of the first sacrificial layers may be ZnS, ZnSe, BeS, GaP, etc. Subsequently, the first channel layer 206 is used as a channel of the semiconductor device at the first region I.

A material of the second sacrificial layers 210 is different from a material of the second channel layer 209. In one embodiment, the material of the second sacrificial layers 210 is SiGe, and the material of the second channel layer 206 is Si. In other embodiments, a material of the second channel layer 209 may be Ge or SiGe, and the material of the second sacrificial layers may be ZnS, ZnSe, BeS, GaP, etc. Subsequently, the second channel layer 209 is used as a channel of the semiconductor device at the second region II.

In one embodiment, the first fin member 203 further includes a bottom structure 208 formed at a bottom of the first fin member 203 and over the base substrate 201. The second fin member 204 further includes a bottom 211 formed at a bottom of the first fin member 203 and over the base substrate 201.

A fabrication method of the first fin member 203 includes forming a composite material layer (not shown) over the base substrate 201. The composite material layer includes a plurality of channel material layers stacked over each other (not shown) and a sacrificial layer located between two adjacent channel material layers (not shown). A patterned layer is formed on the surface of the composite material layer. The patterned layer exposes a portion of the composite material layer of the first region I. The fabrication method of the first fin member 203 further includes etching the composite material layer over the first region I and/or a portion of the first region I by using the patterned layer as an etch mask to form the first fin member 203, e.g., to form a first channel layer 206 from the channel material layer of the first region I, and to form the first sacrificial layers 207 from the sacrificial material layers over the first region I.

In one embodiment, a portion of the composite material layer is further exposed by the patterned layer over the second region II. A fabrication method of the second fin member 204 includes etching the composite material layer over the second region II and/or a portion of the second region II by using the patterned layer as an etch mask to form the second fin member 204, e.g., to form the first channel layer 209 from the channel material layer of the first region I, and to form the second sacrificial material layers 210 from the sacrificial material layers of the second region II.

The first region I and the second region II are configured to form semiconductor devices with different channel lengths. Subsequently, the channel length of the semiconductor device of the first region I may be adjusted by adjusting the size of the first opening.

In some embodiments, the base substrate 201 may further include an isolation region 205. The isolation region 205 is located between sidewalls of the first fin member 203 and the second fin member 204. A top surface of the isolation region 205 is flush with a top surface of the first bottom structure 208, and the top surface of the isolation region 205 is also flush with a top surface of the second bottom structure 211.

A material of the isolation region 205 includes one or more silicon oxide, silicon nitride, silicon oxynitride, silicon oxycarbide, silicon carbonitride, or silicon oxycarbonitride. In one embodiment, the material of the isolation region 205 is silicon oxide. The isolation region 205 is configured for electrical insulation between semiconductor devices.

In some embodiments, a first dummy gate structure 212 includes a first dummy gate 213, a first spacer 217 formed on the sidewall of the first dummy gate 213, and a first protection layer 216 formed on a top of the first dummy gate 213.

A material of the first spacer 217 includes one or more of silicon oxide, silicon nitride, silicon oxynitride, silicon oxycarbide, silicon carbonitride, and silicon oxycarbonitride. In one embodiment, the material of the first spacer 217 is silicon nitride.

A material of the first protection layer 216 includes one or more of silicon oxide, silicon nitride, silicon oxynitride, silicon oxycarbide, silicon carbonitride, and silicon oxycarbonitride. In one embodiment, the material of the first protection layer 216 is silicon oxide.

In one embodiment, a material of the first dummy gate 213 includes Si. In another embodiment, the material of the first dummy gate 213 includes polysilicon. In other embodiments, the material of the first dummy gate 213 may further be amorphous silicon, silicon carbide, etc. The first dummy gate 213 occupies space for the subsequent fabrication of the first gate.

In one embodiment, the second dummy gate structure 214 includes the second dummy gate 215, a second spacer 219 formed on the sidewall of the second dummy gate 215, and a second protection layer 218 formed on the top of the second dummy gate 215.

In one embodiment, a material of the second sidewall 219 includes one or more of silicon oxide, silicon nitride, silicon oxynitride, silicon oxycarbide, silicon carbonitride, and silicon oxycarbonitride. In another embodiment, the material of the second sidewall 219 is silicon nitride.

A material of the second protection layer 218 includes one or more of silicon oxide, silicon nitride, silicon oxynitride, silicon oxycarbide, silicon carbonitride, and silicon oxycarbonitride. In one embodiment, the material of the second protection layer 218 is silicon oxide.

In one embodiment, a material of the second dummy gate 215 includes Si. In another embodiment, the material of the second dummy gate 215 includes polysilicon. In other embodiments, the material of the second dummy gate 215 may further include amorphous silicon, silicon carbide, etc. The second dummy gate 215 occupies space for the subsequent fabrication of the second gate.

It should be noted that FIGS. 9 to 14 illustrate cross-sectional views of the semiconductor structure consistent with the cross-sectional view illustrated in FIG. 7.

Figure 9:
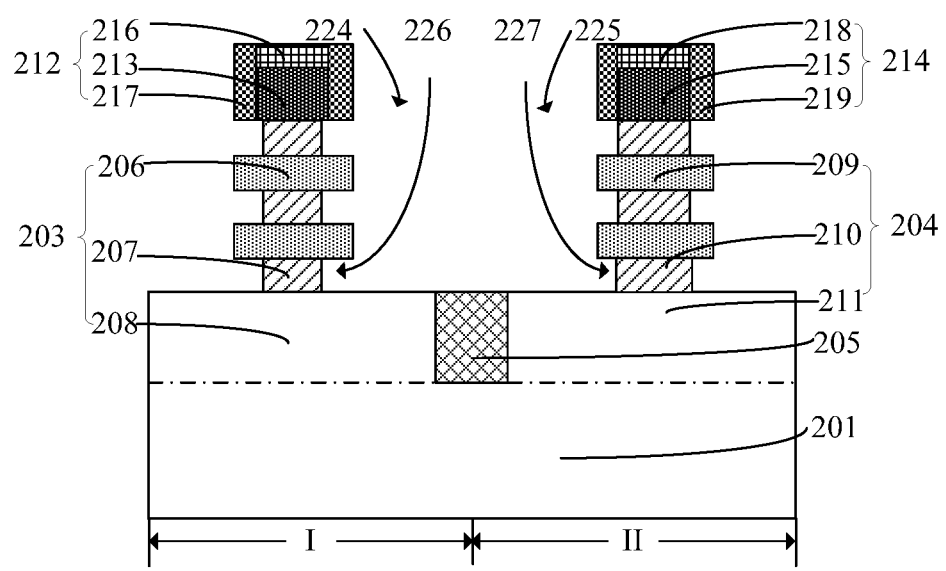

Referring to FIG. 9, a first opening 224 is formed in the first fin member 203 on each of both sides of the first dummy gate 213. After the first opening 224 is formed, the first sacrificial layers 207 are etched for forming second openings 226 each between two adjacent first channel layers 206. The second opening 226 exposes the sidewalls of the etched first sacrificial layers 207. The sidewalls of the first sacrificial layers 207 are recessed relative to the sidewall of the first dummy gate 213. A third opening 225 is formed in the second fin member 204 on each of both sides of the second dummy gate 215. After the third opening 225 is formed, the second sacrificial layers 210 is etched to form a fourth opening 227 between two adjacent second channel layers 209. The fourth opening 227 exposes the sidewalls of the second sacrificial layers 210. The sidewalls of the second sacrificial layers 210 are recessed relative to the sidewalls of the second channel layer 209. The sidewalls of the second sacrificial layers 210 exposed by the fourth opening 227 protrude or are flush with the sidewalls of the second dummy gate 215.

A fabrication method of the first opening 224 includes etching the first fin member 203 by using the first dummy gate 213 as a mask, then the first opening 224 is formed in the first fin member 203. In one embodiment, the fabrication method further includes etching the first fin member 203 by using the first dummy gate structure 212 as a mask to form the first opening 204 in the first fin member 203. The first opening 224 is configured to form a first source-drain layer in a subsequence process.

A formation process of the first opening 224 includes one or a combination of a dry etching process and a wet etching process. In one embodiment, the formation process of the first opening 224 is the dry etching process. The process parameters of the dry etching process include an etching gas of one or a combination of $CF_4$ and $CHF_3$ and a power from 300 watts to 1000 watts. The dry etching process facilitates the formation of the first opening 224 with a better topography.

The formation process of a second opening 226 includes the wet etching process. The process parameters of the wet etching process include a chemical solution of hydrochloric acid with a concentration from 20% to 90%, a temperature from 20° C. to 80° C., and duration from 10 seconds to 500 seconds. Since the hydrochloric acid has a larger selection ratio for the first sacrificial layer 207 over the first channel layer 206, which facilities formation of the second opening 226 and reduces etching damages for the first channel layer 206.

Subsequently, an inner spacer is formed in the second opening 226. The size of the first inner spacer along an extending direction of the first fin member 203 may be adjusted by adjusting the size of the second opening 226. As such, after the gate is subsequently formed, the length of the first channel layer 206 (that is, the channel) wrapped by the gate may be able to be adjusted by adjusting the size of the second opening 226 along the extending direction of the first fin member 203.

A fabrication method of the third opening 225 includes etching the second fin member 204 by using the second dummy gate 215 as a mask, then the third opening 225 is formed in the second fin member 204. In one embodiment, the fabrication method further includes etching the second fin member 204 by using the second dummy gate structure 214 as a mask to form the third opening 225 in the second fin member 204. The third opening 225 is configured to subsequently form a second source-drain layer.

A formation process of the third opening 225 includes one or a combination of the dry etching process and the wet etching process. In one embodiment, the formation process of the third opening 225 is a dry etching process. The process parameters of the dry etching process include the etching gas of one or a combination of $CF_4$ and $CHF_3$, and the power from 300 watts to 1000 watts. The dry etching process facilitates the formation of the third opening 225 with a better topography. The third opening 225 and the first opening 224 may be completed in a same process, which saves processes and reduces production costs.

A formation process of the fourth opening 226 includes the wet etching process. The process parameters of the wet etching process include a chemical solution of hydrochloric acid with the concentration from 20% to 90%, the temperature range from 20° C. to 80° C., and the duration is 15 s to 550 s. The hydrochloric acid has a larger selection ratio for the second sacrificial layers 210 to the second channel layer 209, which is facilities to form the fourth opening 227 and reduce the etching damage to the second channel layer 209, and the fourth opening 227 is configured to form a second inner spacer.

Figure 10:
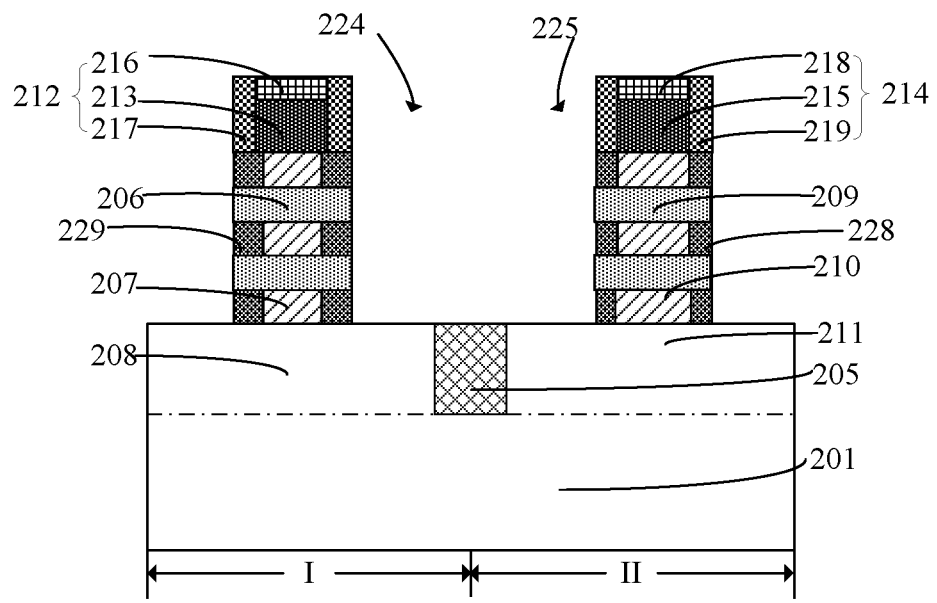

Referring to FIG. 10, the first inner spacer 229 is formed in the second opening 226 (as shown in FIG. 9). The second inner spacer 228 is formed in the fourth opening 227.

In one embodiment, a material of the first inner spacer 229 includes one or more of silicon oxide, silicon nitride, silicon oxynitride, silicon oxycarbide, silicon carbonitride, and silicon oxycarbonitride. In other embodiments, the material of the first inner spacer 229 is silicon nitride.

The first inner spacer 229 fills the second opening 226 entirely. The first inner spacer 229 makes the channel length of the semiconductor device formed over the first region I to be less than the length of the first channel 206 under the first dummy gate 213, which is configured to form a short channel device. The first inner spacer 229 is further configured to protect the first source-drain layer from damage during the subsequent etching process of forming the first gate, which improves the performance of the semiconductor device. The length described is referred to as the size along the extending direction of the first fin member 203.

The second inner spacer 228 is also configured to protect the second source-drain layer from damage during the subsequent etching process for forming the second gate, which improves the performance of the semiconductor device. The channel length of the device over the second region II may be the length of the second channel 209 under the second dummy gate 215. The channel length of the device over the second region II is largely determined by the photolithography process of forming the dummy gate 215, and the length is referred to as the size along the extending direction of the second fin member 204.

A size of the first inner spacer 229 along the extending direction of the first fin member 203 ranges from 2 nm to 8 nm. A size of the second inner spacer 228 along the extending direction along the second fin member 204 ranges from 1 nm to 6 nm. The size of the second inner spacer 228 along the extension direction of the second fin member 204 (that is, the thickness of the second inner spacer 228) is smaller than that of the first inner spacer 229 along the extending direction of the first fin member 203 (that is, the thickness of the first inner spacer 229). The first inner spacer 229 is configured to form the first channel 206 with different lengths and short channel devices, and the second inner spacer 228 is configured to form long channel devices.

The second inner spacer 228 fills the fourth opening 227 entirely.

A material of the second inner spacer 228 includes one or more of silicon oxide, silicon nitride, silicon oxynitride, silicon oxycarbide, silicon carbonitride, and silicon oxycarbonitride. In one embodiment, the material of the second inner side wall 228 is silicon nitride.

A fabrication method of the first inner spacer 229 includes forming a barrier material layer (not shown in the figure) on the surface of the first dummy gate 213 and the base substrate 201 and back-etching the barrier material layer until a bottom surface of the first opening 224 and a surface of the first channel layer 206 of the sidewall of the first opening 224 are exposed to form the first inner spacer 229. For example, the barrier material layer is located on the surface of the isolation region 205, the sidewalls and the bottom of the first opening 224, inside the second opening 226, and the sidewalls and a top portion of the first dummy gate structure 212.

In one embodiment, a fabrication method of the second inner spacer 228 includes that the barrier material layer is also located over the second region II and the surface of the second dummy gate 214. The bottom surface of the third opening 224 and the surface of the second channel layer 209 of the sidewall of the third opening 225 are exposed by back-etching the barrier material layer, so as to form the second inner spacer 228. For example, the barrier material layer is formed on the sidewalls and bottom of the third opening 226, inside the fourth opening 227, and the sidewalls and a top portion of the second dummy gate structure 214.

Figure 11:
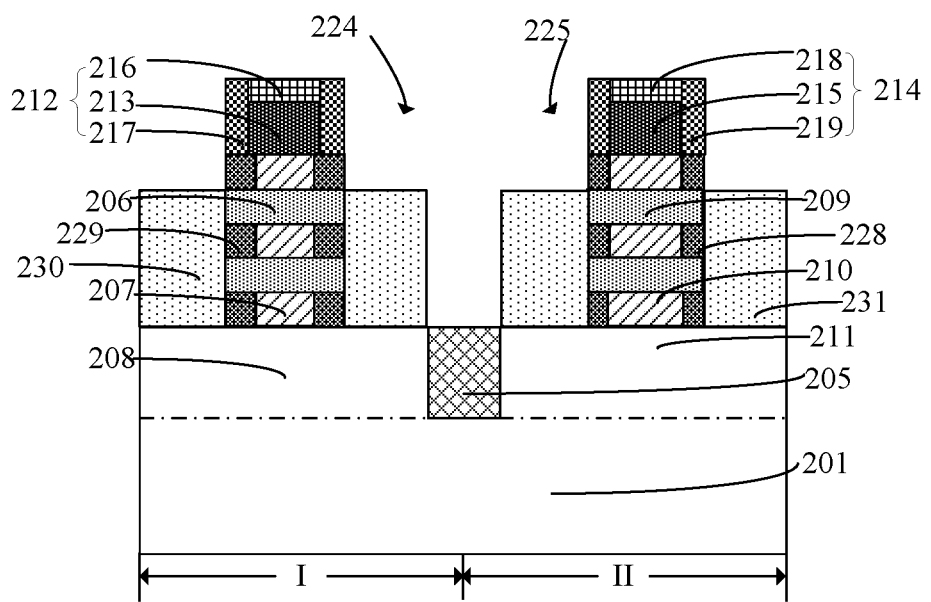

Referring to FIG. 11, after the first inner spacer 229 is formed, a first epitaxial layer (not shown in the figure) is also formed in the first opening 224, and a first dopant ion is doped into the first epitaxial layer to form a first source-drain layer 230.

The first dopant ion includes an N-type ion or P-type ion. In one embodiment, the first dopant ion is an N-type ion, which is configured to form an N-type device over the first region I.

In one embodiment, after forming the second inner spacer 228, a second epitaxial layer (not shown in the figure) is also formed in the third opening 225, and a second dopant ion is doped into the second epitaxial layer to form a second source-drain layer 231.

The second dopant ion includes an N-type ion or P-type ion. In one embodiment, the second dopant ion is a P-type ion, which is configured to form a P-type device over the second region II.

Returning to FIG. 15, after forming the source-drain layer, an interlayer dielectric material layer and an interlayer dielectric layer may be formed on the surface (S111).

Figure 12:
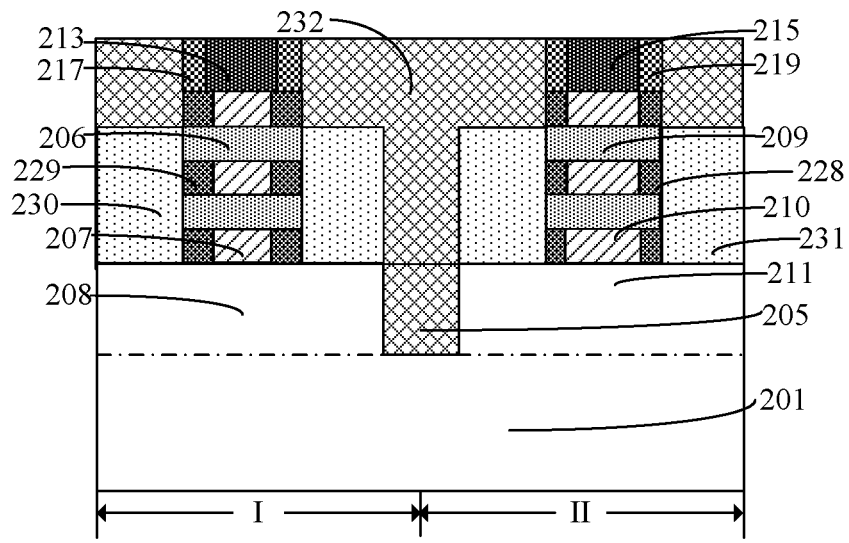

Referring to FIG. 12, after forming the first source-drain layer 230, an interlayer dielectric material layer (not shown in the figure) is formed on the surface of the base substrate 201, the surface of the first source-drain layer 230, the sidewalls and the surface of the first dummy gate 213. The interlayer dielectric material layer is planarized until the top surfaces of the first dummy gate 213 and the second dummy gate 215 are exposed, then an interlayer dielectric layer 232 is formed.

In one embodiment, for example, the interlayer dielectric material layer may be located on the surface of the isolation region 205, the surface of the first source-drain layer 230, the surface of the second source-drain layer 231, the sidewalls and the surface of the first dummy gate structure 212 (shown in FIG. 11), and the sidewalls and surface of the second dummy gate structure 214 (shown in FIG. 11).

In one embodiment, a material of the interlayer dielectric layer 232 includes one or more of silicon oxide, silicon nitride, silicon oxynitride, silicon oxycarbide, silicon carbonitride, and silicon oxycarbonitride. In other embodiments, the material of the interlayer dielectric layer 232 is silicon oxide.

A formation process of the interlayer dielectric layer 232 includes a chemical vapor deposition (CVD) process.

Figure 13:
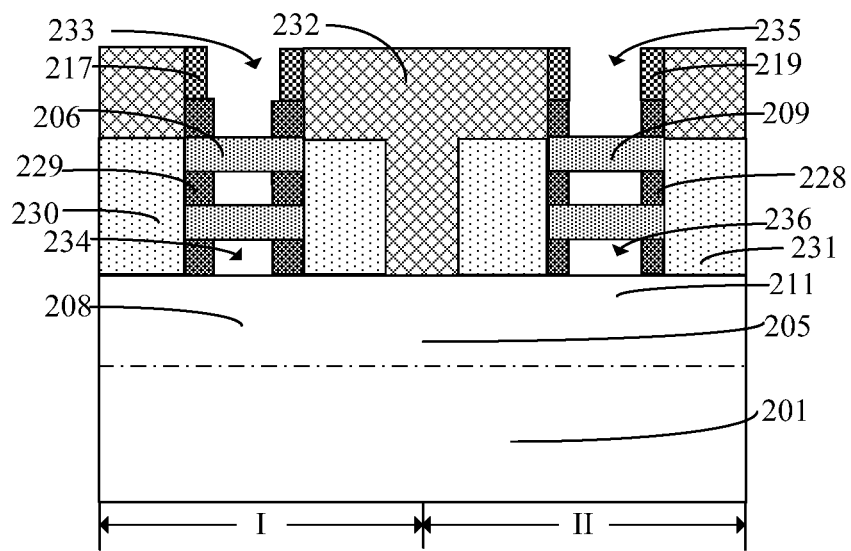

Referring to FIG. 13, after forming the interlayer dielectric layer 232 and removing the first dummy gate 213, a first trench 233 is formed in the interlayer dielectric layer 232. The first sacrificial layer 207 exposed at the bottom of the first trench 233 is removed. A second trench 234 is formed between two adjacent first channel layers 206 exposed at the bottom of the first trench 233.

In one embodiment, the second dummy gate 215 is also removed to form a third trench 235 in the interlayer dielectric layer 232. The second sacrificial layers 210 exposed at the bottom of the third trench 235 are removed, and a fourth trench 236 is formed between two adjacent second channel layers 209 exposed at the bottom of the second trench 235.

A process for removing the first dummy gate 213 includes one or a combination of the dry etching process and the wet etching process.

A process for removing the second dummy gate 215 includes one or a combination of the dry etching process and the wet etching process.

In one embodiment, both the first dummy gate 213 and the second dummy gate 215 adopt the wet etching process and are removed in the same process, which saves processes and reduces production costs.

A process of removing the first sacrificial layers 207 exposed at the bottom of the first trench 233 includes the wet etching process, and the process for removing the second sacrificial layer 210 exposed at the bottom of the third trench 235 includes the wet etching process. In one embodiment, the second trench 234 and the fourth trench 236 are formed by using the wet etching process, and they are formed in the same process, which saves process steps and reduces production costs.

A width of the first trench 233 is greater than a width of the second trench 234. The width is referred to as a size parallel to the surface of the base substrate 201, which facilitates the subsequent filling of gate material in the second trench 234, so as to reduce closure of the first trench 233 that is above the second trench 234 before the second trench is filled, which reduces the probability of defects in the formed gate, thereby improving the performance of the formed semiconductor device.

Figure 14:
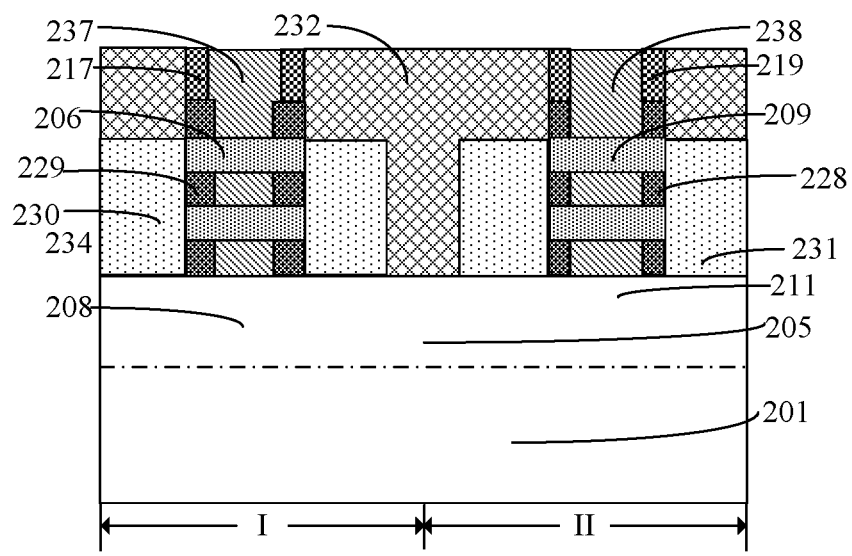

Referring to FIG. 14, a first gate 237 is formed in the first trench 233 and the second trench 234.

In one embodiment, a second gate 239 is formed in the third trench 235 and the fourth trench 236.

A material of the first gate 237 includes metal, and the metal includes tungsten (W), aluminum (Al), copper (Cu), etc. In one embodiment, the material of the first gate 237 is W.

A formation process of the first gate 237 includes the CVD process, an atomic layer deposition (ALD) process, a physical vapor deposition (PVD) process, etc.

A material of the second gate 238 includes metal, and the metal includes W, Al, Cu, etc. In one embodiment, the material of the second gate 237 is W.

The formation process of the first second 238 includes the CVD process, the ALD process, a PVD process, etc.

In one embodiment, the first gate 237 and the second gate 238 are formed by the ALD process. The ALD process includes a good step coverage, which is beneficial to reduce the defects in the first gate 237 and the second gate 238 during the formation process. In another aspect, the width of the first trench 233 is greater than the width of the second trench 23, which reduces closure of the first trench 233 before the closure of the second trench, which is beneficial for filling metal material in the first trench 233 and the second trench 234, thereby improving the quality of the formed first gate 237 and the performance of the semiconductor device.

Correspondingly, an embodiment of the present disclosure further provides a semiconductor structure formed by the above method. Referring to FIG. 9, the semiconductor structure includes the base substrate 201. The base substrate 201 includes the region I and the region II. The first fin member 203 is located over the first region I. The first fin member 203 includes a plurality of first sacrificial layers 207 stacked over each other and the first channel layer 206 located between two adjacent first sacrificial layers 207. The second region II includes the second fin member 204, and the second fin member 204 includes a plurality of second sacrificial layers 210 stacked over each other and the second channel layer 209 located between two adjacent second sacrificial layers 210. The semiconductor structure further includes the first dummy gate 213 across the surface of the first fin member 203, and the first dummy gate 213 is located on a portion of the top surface and a portion of the sidewall surface of the first fin member 203. The semiconductor structure further includes the second dummy gate 215 across the surface of the second fin member 204, and the second dummy gate 215 is located on a portion of the top surface and a portion of the sidewall surface of the second fin member 204. The first opening is formed in the first fin member 203 on each of both sides of the first dummy gate 213. The third opening is formed in the second fin member 204 on each of both sides of the second dummy gate 215. The second opening 226 is formed between two adjacent first channel layers 206. The sidewalls of the first sacrificial layers 207 exposed by the second opening 226 are recessed relative to the sidewall of the first dummy gate 213. The fourth opening 227 is formed between two adjacent second channel layers 209, and the sidewalls of the second sacrificial layers 210 exposed by the fourth opening 227 are recessed relative to the sidewall of the second channel layer 209. The sidewalls of the second sacrificial layers 210 exposed by the fourth opening 227 protrude from or are flush with the sidewall of the second dummy gate 215. The first inner spacer 229 (as shown in FIG. 10) is formed in the second opening 226, and the second inner spacer 228 (shown in FIG. 10) is formed in the fourth opening 227.

The material of the first sacrificial layers 207 is different from the material of the first channel layer 206. The material of the first sacrificial layer 207 includes SiGe, and the material of the first channel layer 206 includes Si.

A size of the first inner spacer 229 along the extending direction of the first fin member 203 ranges from 2 nm to 8 nm, which may be adjusted by adjusting the size of the second opening 226. As such, after the gate is subsequently formed, the length of the first channel layer 206 (that is, the channel) wrapped by the gate may be able to be adjusted by adjusting the size of the second opening 226 along the extending direction of the first fin member 203.

The first inner spacer 229 fills the second opening 226 entirely.

The material of the second inner spacer 228 includes one or more of silicon oxide, silicon nitride, silicon oxynitride, silicon oxycarbide, silicon carbonitride, and silicon oxycarbonitride.

The material of the second sacrificial layers 210 is different from the material of the second channel layer 209. The material of the second sacrificial layers 210 includes silicon germanium, and the material of the second channel layer 209 includes Si. The material of the second dummy gate 215 includes Si.

The sidewall of the second dummy gate 215 further includes the second inner spacer 219.

The material of the first dummy gate 213 includes Si.

The material of the first inner spacer 229 includes one or more of silicon oxide, silicon nitride, silicon oxynitride, silicon oxycarbide, silicon carbonitride, and silicon oxycarbonitride.

The first spacer 217 is formed on the first dummy gate 213.

The disclosed embodiments may have the following beneficial effects. In the fabrication method of the semiconductor structure of the present disclosure, a first opening is formed in a first fin member on each of both sides of a first dummy gate. After the first opening is formed, a second opening is formed between two adjacent first channel layers and exposing a sidewall of a corresponding first sacrificial layer by etching a first sacrificial layer, where the second opening is recessed relative to the sidewall of the first dummy gate. A first inner spacer is formed in the second opening. A second inner spacer is formed in the fourth opening. In one aspect, the thickness of the first inner spacer and the second sidewall are different, and the thickness of the first inner spacer may be adjusted by adjusting the size of the second opening. As such, after the gate is subsequently formed, the length of the first channel layer (that is, the channel) wrapped by the gate may be able to be adjusted by adjusting the size of the second opening 226 along the extending direction of the first fin member. In another aspect, during the subsequent formation of the gate, the first dummy gate is removed, and the width of the first trench formed in the interlayer dielectric layer is larger than the width of the first sacrificial layers exposed at the bottom of the first trench. The channel length is the width of the formed second trench by removing the first sacrificial layer exposed at the bottom of the first trench. Since the width of the first trench is greater than the width of the second trench, which facilitates the subsequent filling of gate material in the second trench, so as to reduce closure of the first trench that is above the second trench before the second trench is filled, which reduces the probability of defects in the formed gate, thereby improving the performance of the formed semiconductor device.

The embodiments disclosed in the present disclosure are exemplary only and do not limit the scope of the present disclosure. Various alternations and modifications can be made by those skilled in the art without departing from the spirit of the present disclosure. Therefore, the scope of the invention should be subject to the scope of the claims.

What is claimed is:

1. A semiconductor structure, comprising:
   a base substrate, wherein the base substrate includes a first region and a second region,
   a first fin member located over the first region of the base substrate, wherein the first fin member includes first sacrificial layers stacked over each other and a first channel layer located between two adjacent first sacrificial layers; and
   a second fin member located over the second region of the base substrate, wherein the second fin member includes second sacrificial layers stacked over each other and a second channel layer located between two adjacent second sacrificial layers;
   a first dummy gate across a surface of the first fin member and on a portion of a top surface and a portion of a sidewall surface of the first fin member;
   a second dummy gate across a surface of the second fin member and on a portion of a top surface and a portion of a sidewall surface of the second fin member, wherein:
   a first opening is formed in the first fin member on each side of the first dummy gate,
   a second opening is formed between two first channel layers and exposing a sidewall of a corresponding first sacrificial layer, wherein the second opening is recessed relative to a sidewall of the first dummy gate,
   a third opening is formed in the second fin member on each side of the second dummy gate, and
   a fourth opening is formed between two second channel layers and exposing a sidewall of a corresponding second sacrificial layer, wherein the fourth opening is recessed relative to a sidewall of the second channel layer, and the sidewall of the corresponding second sacrificial layer exposed by the fourth opening is flush with a sidewall of the second dummy gate;
   a first inner spacer located in the second opening; and
   a second inner spacer located in the fourth opening.

2. The semiconductor structure according to claim 1, wherein:
   a material of the first sacrificial layers is different from a material of the first channel layer;
   the material of the first sacrificial layers includes silicon germanium, and the material of the first channel layer includes silicon;

a material of the second sacrificial layers is different from a material of the second channel layer; and the material of the second sacrificial layers includes silicon germanium, and the material of the second channel layer includes silicon.

3. The semiconductor structure according to claim 1, wherein:

a size of the first inner spacer along an extending direction of the first fin member ranges from 2 nm to 8 nm.

4. The semiconductor structure according to claim 1, wherein:

a size of the second inner spacer along an extending direction of the second fin member ranges from 1 nm to 6 nm.

5. The semiconductor structure according to claim 1, wherein:

the first inner spacer fills the second opening entirely.

6. The semiconductor structure according to claim 1, wherein:

a material of the first inner spacer includes one or more of silicon oxide, silicon nitride, silicon oxynitride, silicon oxycarbide, silicon carbonitride, and silicon carbon oxynitride; and a material of the second inner spacer includes one or more of silicon oxide, silicon nitride, silicon oxynitride, silicon oxycarbide, silicon carbonitride, and silicon oxycarbonitride.

7. The semiconductor structure according to claim 1, wherein:

a material of the first dummy gate includes silicon; and
a material of the second dummy gate includes silicon.

8. The semiconductor structure according to claim 1, wherein:

a first spacer is formed on the sidewall of the first dummy gate; and a second spacer is formed on the sidewall of the second dummy gate.

9. A fabrication method of a semiconductor structure, comprising:

providing a base substrate, wherein the base substrate includes a first region and a second region;

providing a first fin member at the first region of the base substrate, wherein the first fin member includes first sacrificial layers stacked over each other and a first channel layer located between two adjacent first sacrificial layers; and providing a second fin member at the second region of the base substrate, wherein the second fin member includes second sacrificial layers stacked over each other and a second channel layer located between two adjacent second sacrificial layers;

forming a first dummy gate across a surface of the first fin member and on a portion of a top surface and a portion of a sidewall surface of the first fin member;

forming a second dummy gate across a surface of the second fin member and on a portion of a top surface and a portion of a sidewall surface of the second fin member;

forming a first opening in the first fin member on each side of the first dummy gate;

forming a second opening between two adjacent first channel layers and exposing a sidewall of a corresponding first sacrificial layer, wherein the second opening is recessed relative to a sidewall of the first dummy gate;

forming a third opening in the second fin member on each side of the second dummy gate, and forming a fourth opening located between two second channel layers and the exposing a sidewall of a corresponding second sacrificial layer, wherein the fourth opening is recessed relative to a sidewall of the second channel layer, and the sidewall of the corresponding second sacrificial layer exposed by the fourth opening is flush with a sidewall of the second dummy gate;

forming a first inner spacer in the second opening; and
forming a second inner spacer in the fourth opening.

10. The method according to claim 9, wherein forming the first fin member includes:

forming a composite material layer on the base substrate, wherein the composite material layers include channel material layers stacked over each other and a sacrificial layer between two channel material layers;

forming a patterned layer on a surface of the composite material layer, wherein the patterned layer exposes a portion of the composite material layer of the first region;

etching the composite material layer and the first region by using the patterned layer as a mask to form the first fin member;

forming the first channel layer by using the channel material layer of the first region; and forming the first sacrificial layer by using the channel material layer of the first region.

11. The method according to claim 9, wherein forming the first opening includes:

etching the first fin member by using the first dummy gate as the mask to form the first opening in the first fin member.

12. The method according to claim 9, wherein forming the first opening includes a dry etching process, a wet etching process, or a combination of the dry etching process and the wet etching process.

13. The method according to claim 9, wherein forming the second opening includes a wet etching process.

14. The method according to claim 9, wherein forming the first inner spacer includes:

forming a barrier material layer on a surface of the first dummy gate and the base substrate; and back-etching the barrier material layer until a bottom surface of the first opening and a surface of the first channel layer of the first opening sidewall are exposed to form the first inner spacer.

15. The method according to claim 9, further comprising, after forming the first inner spacer:

forming a first epitaxial layer in the first opening;

doping dopant ions in the first epitaxial layer to form a first source-drain layer;

forming an interlayer dielectric material layer on a surface of the base substrate, a surface of the source-drain layer, the sidewall, and a surface of the first dummy gate after forming the source-drain layer;

planarizing the interlayer dielectric material layer until a top surface of the first dummy gate is exposed to form an interlayer dielectric layer;

removing the first dummy gate to form a first trench in the interlayer dielectric layer;

removing the exposed first sacrificial layer at a bottom of the first trench to form a second trench between two adjacent first channel layers exposed at the bottom of the first trench; and forming a first gate in the first trench and the second trench.

16. The method according to claim 9, wherein the first inner spacer fills the second opening entirely.